United States Patent [19]

Brownell et al.

[11] Patent Number: 4,515,668

[45] Date of Patent: May 7, 1985

[54] METHOD OF FORMING A DIELECTRIC LAYER COMPRISING A GETTERING MATERIAL

[75] Inventors: David J. Brownell, Maple Grove; Jon A. Roberts, Minnetonka, both of Minn.

[73] Assignee: Honeywell Inc., Minneapolis, Minn.

[21] Appl. No.: 603,858

[22] Filed: Apr. 25, 1984

[51] Int. Cl.³ .............................................. C23C 15/00
[52] U.S. Cl. .............................. 204/192 D; 204/192 S; 204/192 SP
[58] Field of Search ........................ 204/192 D, 192 S

[56] References Cited

U.S. PATENT DOCUMENTS

| | | | |
|---|---|---|---|
| 3,743,587 | 7/1973 | Kennedy | 204/192 |
| 3,907,616 | 9/1975 | Wiemer | 204/192 D |
| 3,983,022 | 9/1976 | Auyang et al. | 204/192 |
| 4,013,532 | 3/1977 | Cormia et al. | 204/192 D |
| 4,013,533 | 3/1977 | Cohen-Solal | 204/192 S |
| 4,177,474 | 12/1979 | Ovshinsky | 204/192 S |
| 4,191,603 | 3/1980 | Garbarino et al. | 148/147 |
| 4,202,916 | 5/1980 | Chadda | 427/82 |
| 4,260,425 | 4/1981 | Ulrich et al. | 134/2 |
| 4,271,582 | 6/1981 | Shirai et al. | 29/571 |
| 4,273,805 | 6/1981 | Dawson et al. | 427/88 |
| 4,384,933 | 5/1983 | Takasaki | 204/192 D |

OTHER PUBLICATIONS

A. C. Adams, Plasma Planarization, Solid State Technology, Apr. 1981, 178–181.
S. N. Ghosh Dastidar, Diffusion of Phosphorus into Silicon Using Phosphine Gas as a Source, Solid State Technology, Nov. 1975, 37–46.
Paul et al. Solid State Commun. 20 (1976) pp. 969–972.

Primary Examiner—Arthur P. Demers
Attorney, Agent, or Firm—John P. Sumner

[57] ABSTRACT

The present invention comprises a method of forming a thin film dielectric layer on a substrate. The method comprises providing a sputtering chamber having a dielectric target disposed on a target electrode. A substrate to be covered with a thin film dielectric layer is introduced into the sputtering chamber and the substrate is located on a substrate holder electrode spaced from the target electrode. The chamber is then evacuated, and a sputtering atmosphere comprising an inert gas and a gas containing an element of a gettering material is introduced into the chamber. The gas containing an element of a gettering material is transferred into the chamber through a metering valve from a container outside the chamber. An RF potential is applied across the target electrode and the substrate electrode to establish a glow discharge in the region between the electrodes. Finally, a thin film dielectric layer doped with a gettering material is formed by a chemical reaction in the chamber.

27 Claims, 2 Drawing Figures

METHOD OF FORMING A DIELECTRIC LAYER COMPRISING A GETTERING MATERIAL

BACKGROUND OF THE INVENTION

The present invention relates to the formation of a dielectric layer comprising a gettering material.

Historically, phosphorous doped glasses have been used to passivate semiconductor surfaces and to planarize the surface topology. Gettering is needed to prevent charging of the semiconductor at the oxide semiconductor interface by alkali metal ions such as sodium. Phosphorous getters the alkaline ions and makes them immobile.

The present invention provides a unique approach to forming a dielectric layer comprising a gettering material. The present invention is also compatible with simultaneously achieving not only the gettering properties but also planarization through resputtering.

SUMMARY OF THE INVENTION

The present invention comprises a method of forming a thin film dielectric layer on a substrate. The method comprises providing a sputtering chamber having a dielectric target disposed on a target electrode. A substrate to be covered with a thin film dielectric layer is introduced into the sputtering chamber and the substrate is located on a substrate holder electrode spaced from the target electrode. The chamber is then evacuated, and a sputtering atmosphere comprising an inert gas and a gas containing an element of a gettering material is introduced into the chamber. The gas containing an element of a gettering material is transferred into the chamber through a metering valve from a container outside the chamber. An RF potential is applied across the target electrode and the substrate electrode to establish a glow discharge in the region between the electrodes. A thin film dielectric layer doped with a gettering material is then formed by a chemical reaction in the chamber.

DESCRIPTION OF THE PREFERRED EMBODIMENTS

Figure 1:
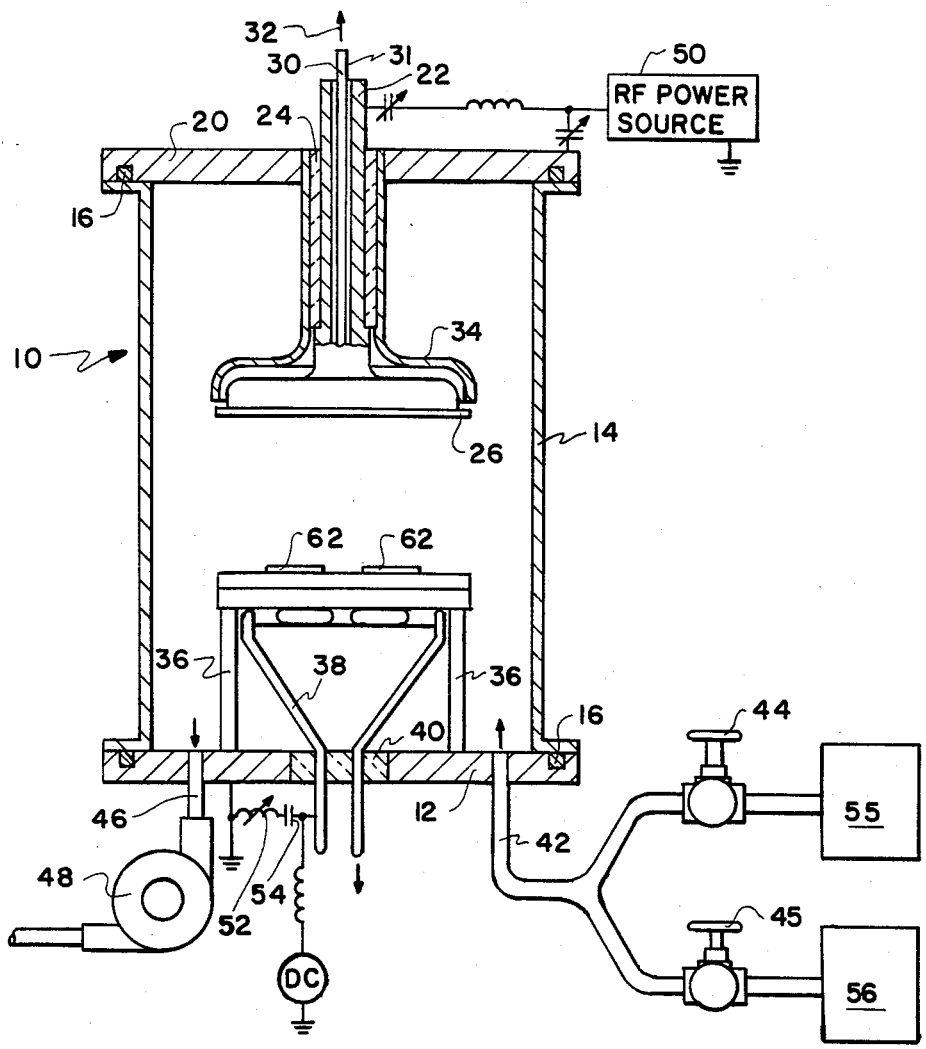
FIG. 1 illustrates an apparatus compatible with the present invention.

An RF sputtering apparatus 10 suitable for use in practicing the present invention is depicted in FIG. 1. Apparatus 10 has a chamber consisting of a base plate 12, a cylindrical wall 14 supported on plate 12 with the joint sealed with a seal 16, and a top plate 20 resting on the top flange of cylinder wall 14 with the joint sealed with a second seal 16. A target electrode 22 is supported on a plate 20 and insulated from plate 20 with a dielectric member 24. Target 26 is supported at the bottom of target electrode 22 in opposed relation to substrate holder electrode 28.

Target electrode 22 is preferably cooled by providing a concentrically disposed tube 30 within a hollow stem portion of electrode 22, and water or another cooling liquid is circulated through the tube and hollow stem portion as indicated by arrows 31 and 32.

A shield 34 surrounds the target electrode 22 and is spaced from target electrode 22 to prevent sputtering of the back side of target 26.

Substrate holder electrode 28 is supported on legs 36 of dielectric material which engage base plate 12. A cooling tube 38 engages the bottom side of electrode 28 and serves both as a means for cooling the electrode and providing electrical contact to the electrode. Tube 38 extends through base plate 12 through a dielectric plug 40.

The RF sputtering apparatus illustrated is oriented for vertical sputtering. Alternately, the orientation of target 26, substrate holder electrode 28, and chamber 10 may be rotated 90 degrees to place substrates 62 in a vertical plane in order to reduce the probability of film defects from particles falling on substrates 62. Such side sputtering apparatus is well known in the art.

An inlet 42 is provided with a suitable manifold and metering valves 44 and 45 for introducing, measuring, and controling quantities of gases compatible with the present invention into chamber 10. Alternately, more than one inlet may be used. Gases used in accordance with the present invention are typically stored in containers such as 55 and 56 connected to inlet 42 through valves such as 44 and 45.

An outlet 46 connected to a vacuum pump 48 is used to exhaust the inside of the chamber. An RF power source 50 is arranged to apply an RF potential across base plate 12 and target electrode 22. A variable impedance 52 and capacitor 54 are connected in series across the base plate 12 and substrate holder electrode 28 in order to place a bias on electrode 28 for use in RF bias sputtering. Alternately, separate RF power supplies can be used to separately apply RF power to target electrode 22 and substrate holder electrode 28.

When RF power source 50 is activated, a visible glow discharge is formed between target holder electrode 22 and substrate holder electrode 28, and particles from target 26 bombard and are deposited on substrates 62 supported on substrate holder 28.

If a bias is placed on electrode 28, the RF sputtering process then becomes RF bias sputtering, and the bias between the target electrode and the substrate holder electrode causes resputtering at the substrate or semiconductor device 62. The bias accelerates ions to the substrate and takes advantage of the angular dependence of the sputter yield. This helps reduce cusping at the edges of underlying topographical features since the dielectric elevations have sloping edges which are more easily covered in subsequent processing.

In practicing the present invention, a sputtering chamber 10 having a dielectric target 26 such as $SiO_2$ is provided.

A substrate or wafer 62 to be covered with a thin film dielectric layer is introduced into sputtering chamber 10 and located on substrate holder electrode 28.

Chamber 10 is then evacuated with vacuum pump 48, and a sputtering atmosphere comprising an inert gas (e.g. Ar, Kr) and a gas containing an element of a gettering material is introduced into chamber 10. The gas containing an element of a gettering material is transferred into chamber 10 through chamber inlet 42 from a container such as 55 or 56 outside the chamber.

Typically the gas containing an element of a gettering material will include phosphorous as an element. For phosphorous containing gases, the gas containing an element of a gettering material may be selected from the group consisting of $PH_3$, $POCl$, and $PF_3$. Other gases containing phosphorous, or other gases containing an element of a gettering material other than phosphorous may also be used.

In view of the toxic nature of, for example, PH₃, the gas containing an element of a gettering material is typically introduced in combination with the inert gas, e.g., Ar. Thus, for example, a tank of gas comprising 2% $PH_3$ and 98% Ar may be connected to inlet 42 through valve 44 for introducing argon and $PH_3$ into chamber 10. The percentage of the gas containing an element of a gettering material may then be varied with respect to the percentage of argon in the chamber by connecting a bottle of gas comprising $O_2$ and Ar to inlet 42 through valve 45. Alternately, $O_2$ can be introduced separately through a parallel valve.

It is typically desired that the dielectric film deposited on substrate or wafer 62 contain a gettering material in the range of 2 to 5%. Such a range is normally sufficient to achieve the objectives of most gettering applications. Using the process of the present invention as disclosed above, the relative percentage of the gas containing the gettering material and the inert gas in chamber 10 can be easily adjusted and controlled. Through this adjustment and control, one can consistently achieve the desired percentage of gettering material in the dielectric films created.

An RF potential is then applied across target electrode 22 and substrate holder electrode 28 to establish a glow discharge in the region between the electrodes. A thin film dielectric layer doped with a gettering material is then formed by a chemical reaction in chamber 10.

A power density in the range of approximately 2 to 5.5 watts/cm² is typical for use in connection with the present process. The partial pressure in chamber 10 created by the sputtering atmosphere is typically in the range of 3 to 20 millitorr. Target 26 may be of any suitable glass such as $SiO_2$.

If it is desired to planarize through resputtering during the RF sputtering process, i.e. to use RF bias sputtering, a DC potential such as −100 volts may be maintained between base plate 12 and substrate holder electrode 28.

Figure 2:
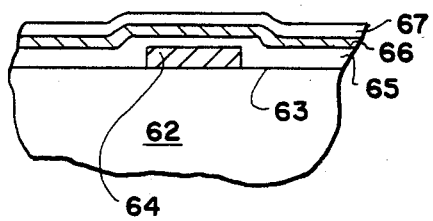
FIG. 2 illustrates an integrated circuit device comprising a thin film dielectric layer doped with a gettering material and formed by the process of the present invention.

An advantage of the present invention is that the dielectric layer doped with the gettering material, e.g., with phosphorous, may be buried between two layers substantially devoid of a gettering material. Such an embodiment is illustrated in FIG. 2, which illustrates a substrate 62 having a metalization interconnect 64 running on a portion of a major surface 63 of substrate 62. The device illustrated in FIG. 2 comprises a first dielectric layer 65 substantially devoid of a gettering material placed over surface 63 and over metalization interconnect 64.

The device then comprises a second dielectric layer 66 formed over first dielectric layer 65, the second dielectric layer comprising a gettering material.

A third layer 67 placed over second dielectric layer 66 may then comprise a dielectric layer 67 substantially devoid of a gettering material. Alternately, layer 67 may comprise another metalization layer such as tungsten which is substantially unaffected by a gettering material such as phosphorous or even a metalization layer 67 comprising aluminum, provided that the gettering material in layer 66 is of a sufficiently low quantity to prevent attack of an aluminum layer 67.

In forming a buried dielectric layer in accordance with the present invention, one first introduces into sputtering chamber 10 a substrate 62 and locates substrate 62 on substrate holder electrode 28. Chamber 10 is then evacuated, and a sputtering atmosphere substantially devoid of a gettering material (e.g. Ar, Kr) is introduced into chamber 10. An RF potential is then applied across target electrode 22 and substrate holder electrode 28 to establish a glow discharge in the region between the electrodes. A first dielectric layer 65 substantially devoid of a gettering material is then formed onto a surface such as 63 of substrate 62.

One then provides a sputtering atmosphere comprising an inert gas (e.g. Ar, Kr) and a gas containing an element of a gettering material into chamber 10. The gas containing an element of a gettering material is transferred into chamber 10 through inlet 42 from a container such as 55 or 56 outside the chamber.

An RF potential is then applied across target electrode 22 and substrate holder electrode 28 to establish a glow discharge in the region between the electrodes. A second dielectric layer 66 is then formed over first dielectric layer 65, second dielectric layer 66 comprising a gettering material formed by a chemical reaction in chamber 10.

As previously indicated, one may then apply a metalization layer 67 unaffected by the gettering material directly over layer 66. Using processing steps well known in the art, such a metalization layer 67 may be formed by depositing a layer of metal, photopatterning the metal, and etching the metal layer to form metalization interconnects.

Alternately, one may form an additional layer 67 of dielectric material so that dielectric layer 66 doped with the gettering material will be buried between two dielectric layers substantially devoid of the gettering material. In such a case, one again evacuates chamber 10, forms a sputtering atmosphere in chamber 10 substantially devoid of a gettering material, applies an RF potential across target electrode 22 and substrate holder electrode 28 to establish a glow discharge in the region between the electrodes, and forms a third dielectric layer 67 over dielectric layer 66.

The present invention is to be limited only in accordance with the scope of the appended claims, since others skilled in the art may devise other processes still within the limits of the claims. For example, gettering materials and gases containing an element of a gettering material other than those listed in the present application may also be compatible with the present invention. Further, those skilled in the art will recognize that thin film dielectric layers doped with a gettering material and formed by the process of the present invention may be located at many different locations and levels of integrated circuits other than the location and level shown in FIG. 2.

The embodiments of the invention in which an exclusive property or right is claimed are defined as follows:

1. A method of forming a thin film dielectric layer on a substrate, comprising:
   providing a sputtering chamber having a dielectric target disposed on a target electrdode;
   introducing into the sputtering chamber a substrate to be covered with a thin film dielectric layer and locating the substrate on a substrate holder electrode spaced from the target electrode;
   evacuating the chamber;
   introducing into the chamber a sputtering atmosphere comprising an inert gas and a gas containing an element of a gettering material, the gas containing an element of a gettering material being transferred into the chamber through a metering valve from a container outside the chamber; and applying an RF potential across the target electrode and the substrate holder electrode to establish a glow discharge in the region between the electrodes in order to deposit a thin film dielectric layer doped with a gettering material formed by a chemical reaction in the chamber.

2. The method of claim 1 wherein a DC potential is applied across the substrate holder electrode.

3. The method of claim 2 wherein the gas containing an element of a gettering material includes phosphorous as an element.

4. The method of claim 3 wherein the gas containing an element of a gettering material is selected from the group consisting of $PH_3$, POCl and $PF_3$.

5. The method of claim 4 wherein the dielectric target comprises $SiO_2$.

6. The method of claim 1 wherein the gas containing an element of a gettering material includes phosphorous as an element.

7. The method of claim 6 wherein the gas containing an element of a gettering material is selected from the group consisting of $PH_3$, POCl and $PF_3$.

8. The method of claim 7 wherein the dielectric target comprises $SiO_2$.

9. The method of claim 1 wherein the dielectric target comprises $SiO_2$.

10. A method of forming a dielectric layer doped with a gettering material over a surface of a substrate and of separating the doped layer from the surface by a dielectric layer substantially devoid of the gettering material, comprising:

providing a sputtering chamber having a dielectric target disposed on a target electrode;

introducing into the sputtering chamber a substrate and locating the substrate on a substrate holder electrode spaced from the target electrode;

evacuating the chamber;

introducing into the chamber a sputtering atmosphere comprising an inert gas, the sputtering atmosphere being substantially devoid of a gettering material;

applying an RF potential across the target electrode and the substrate holder electrode to establish a glow discharge in the region between the electrodes;

forming a first dielectric layer substantially devoid of a gettering material onto a surface of the substrate;

introducing into the chamber a gas containing an element of a gettering material, the gas containing an element of a gettering material being transferred into the chamber through a metering valve from a container outside the chamber; and applying an RF potential across the target electrode and the substrate holder electrode to establish a glow discharge in the region between the electrodes in order to deposit a second dielectric layer over the first dielectric layer, the second dielectric layer being doped with a gettering material formed by a chemical reaction in the chamber.

11. The method of claim 10 wherein the last forming step is followed by the steps of:

evacuating the chamber;

providing a sputtering atmosphere comprising an inert gas, the sputtering atmosphere being substantially devoid of a gettering material; and applying an RF potential across the target electrode and the substrate holder electrode to establish a glow discharge in the region between the electrodes in order to deposit a third dielectric layer over the second layer of dielectric material doped with a gettering material;

whereby the second layer of dielectric material doped with the gettering material is disposed between two layers of dielectric material substantially devoid of the gettering material.

12. The method of claim 11 wherein a DC potential is applied across the substrate holder electrode.

13. The method of claim 12 wherein the gas containing an element of a gettering material includes phosphorous as an element.

14. The method of claim 13 wherein the gas containing an element of a gettering material is selected from the group consisting of $PH_3$, POCl and $PF_3$.

15. The method of claim 14 wherein the dielectric target comprises $SiO_2$.

16. The method of claim 11 wherein the gas containing an element of a gettering material includes phosphorous as an element.

17. The method of claim 16 wherein the gas containing an element of a gettering material is selected from the group consisting of $PH_3$, POCl and $PF_3$.

18. The method of claim 17 wherein the dielectric target comprises $SiO_2$.

19. The method of claim 11 wherein the dielectric target comprises $SiO_2$.

20. The method of claim 10 wherein a DC potential is applied across the substrate holder electrode.

21. The method of claim 20 wherein the gas containing an element of a gettering material includes phosphorous as an element.

22. The method of claim 21 wherein the gas containing an element of a gettering material is selected from the group consisting of $PH_3$, POCl and $PF_3$.

23. The method of claim 22 wherein the dielectric target comprises $SiO_2$.

24. The method of claim 10 wherein the gas containing an element of a gettering material includes phosphorous as an element.

25. The method of claim 24 wherein the gas containing an element of a gettering material is selected from the group consisting of $PH_3$, POCl and $PF_3$.

26. The method of claim 25 wherein the dielectric target comprises $SiO_2$.

27. The method of claim 10 wherein the dielectric target comprises $SiO_2$.

* * * * *